United States Patent [19]
Miyazaki et al.

[11] Patent Number: 5,141,318
[45] Date of Patent: Aug. 25, 1992

[54] LASER INTERFEROMETER TYPE LENGTH MEASURING APPARATUS AND POSITIONING METHOD USING THE SAME

[75] Inventors: Chuichi Miyazaki, Tsukuba; Hideyuki Sakaizawa, Yokohama; Makoto Kurihara, Ibaraki, all of Japan

[73] Assignee: Hitachi, Ltd., Tokyo, Japan

[21] Appl. No.: 664,603

[22] Filed: Mar. 4, 1991

[30] Foreign Application Priority Data

Mar. 2, 1990 [JP] Japan .................................. 2-51236

[51] Int. Cl.⁵ ............................................. G01B 11/02
[52] U.S. Cl. ..................................... 356/358; 250/548
[58] Field of Search ...................... 356/358; 250/548

[56] References Cited

U.S. PATENT DOCUMENTS

| | | | |
|---|---|---|---|
| 4,503,335 | 3/1985 | Takahashi | 250/548 |
| 4,814,625 | 3/1989 | Yasu | 356/358 |
| 4,984,891 | 1/1991 | Miyazaki et al. | 356/358 |

Primary Examiner—Samuel A. Turner
Assistant Examiner—LaCharles P. Keesee
Attorney, Agent, or Firm—Antonelli, Terry, Stout & Kraus

[57] ABSTRACT

In a laser interferometer type length measuring apparatus, a measurement laser beam will be influenced by disturbance such as air fluctuation and a change in air pressure distribution due to movement of an object so that a displacement of the object cannot be accurately measured. In order to obviate such an inconvenience, air controlled at a predetermined temperature is uniformly blown at a fixed speed on the entire optical path of the measurement laser beam.

10 Claims, 4 Drawing Sheets

LASER INTERFEROMETER TYPE LENGTH MEASURING APPARATUS AND POSITIONING METHOD USING THE SAME

BACKGROUND OF THE INVENTION

The present invention relates to a laser interferometer type length measuring apparatus and a positioning method which can provide improved measuring accuracy, and more particularly to an interferometer type length measuring apparatus and a method which are preferably used to improve the accuracy and stability in positioning a wafer in a semiconductor production system.

One of conventional laser interferometer type length measuring apparatus with high measurement accuracy is disclosed in U.S. Pat. No. 4,984,891 assigned to the same applicant of the present invention. This prior art intends to compensate an air fluctuation in the measurement by the following manner. As shown in FIG. 6, a laser beam 20 for compensation is independently located in the neighborhood of a laser beam 4 for measurement. A reflected laser beam of the light beam 20 for compensation reflected from a mirror 26 apart from an interferometer 19 by a predetermined distance interfere with a reference laser beam in the interferometer 19. The interference light 23 thus obtained is processed to provide an output 30 indicative of an air fluctuation. On the other hand, a reflected laser beam of the laser beam 4 for measurement reflected from a mirror 5 interfere with the reference laser beam in another interferometer 3. An interference light 7 thus obtained is processed to provide another output 29 indicative of a displacement of an object (i.e. a displacement of an object 6 provided with the mirror 5) including the air fluctuation. Both outputs thus obtained are taken in a computing device 31 to provide an output 32 indicative of the displacement free from the air fluctuation.

However, the above prior art has the following disadvantage. If there are very non-uniform distributions of temperature and air pressure on the laser beams, and if the laser beams for measurement and for compensation are in different environments, the compensation will be incomplete so that some measurement errors will occur.

More specifically, a difference will occur between the temperature distributions on both beams because of an air fluctuation due to heat from a laser tube, and also a large distribution of the air pressure will occur only on the laser beam for measurement during a measuring object moves. Such phenomena are actually observed in conventional apparatus.

SUMMARY OF THE INVENTION

An object of the present invention is to provide a laser interferometer type length measuring apparatus which can carry out a measurement will high precision and stability by removing the influence such as an air fluctuation and a change in the air pressure distribution due to movement of an object to be measured.

In order to attain the above object, in accordance with the present invention, air is caused to flow on a laser beam over the entire length thereof.

Other objects and features of the present invention will become apparent from the following description taken in conjunction will the accompanying drawings.

DESCRIPTION OF THE PREFERRED EMBODIMENTS

Figure 1:
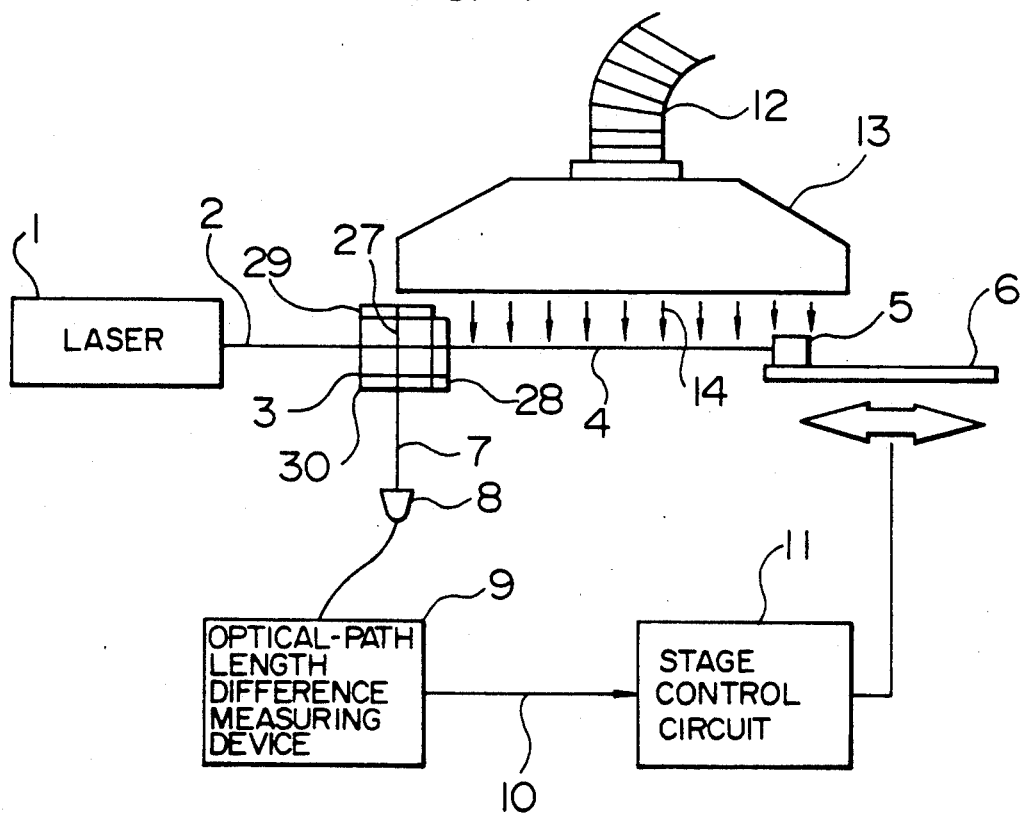
FIG. 1 is a block diagram of the arrangement of an laser interferometer type length measuring apparatus according to one embodiment of the present invention.
Figure 2:
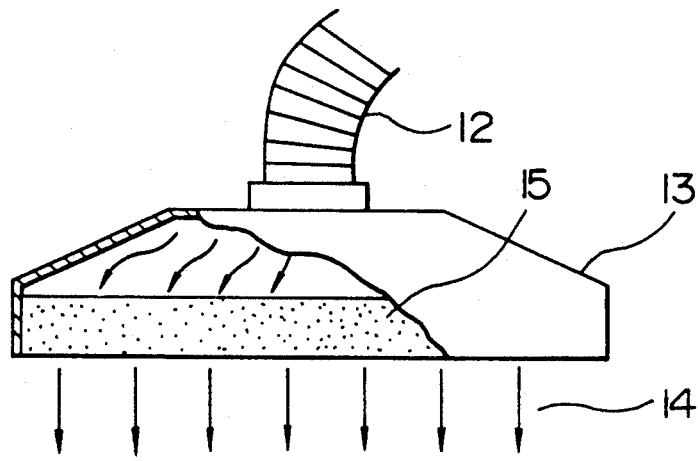
FIGS. 2 and 3 are partially enlarged sectional views of an air blowout vent in the apparatus.

Now referring to FIGS. 1, 2 and 3, an explanation will be given of one embodiment of the present invention. FIG. 1 shows the entire arrangement of a laser interferometer type length measuring apparatus or system according to this embodiment. FIG. 2 shows an air blowout vent in its partially enlarged section. In these figures, like reference numerals designate like elements.

In FIG. 1, 1 denotes a laser source; 3 denotes an interferometer; and 4 denotes a laser beam for measurement which will be influenced by an air fluctuation. This embodiment is designed in such a fashion that air 14 is caused to flow from an air blowout vent 13 toward the measurement laser beam 4 thereby to restrict the air fluctuation around the measurement laser beam 4.

More specifically, a linearly-polarized laser beam 2 emitted from the laser source 1 is divided into the measurement laser beam 4 and a reference laser beam 27 by the polarizing beam splitter (hereinafter referred to as PBS for brevity) located in the interferometer 3. The measurement laser beam 4 passes through a quarter wavelength plate 28 and reaches a bar mirror 5 located on an XY stage 6 which is an object to be measured. Thereafter, the measurement laser beam 4 reflects from the bar mirror 5 and passes through the quarter wavelength plate 28 again to return to the PBS in the interferometer 3. The laser beam, which passes forward and backward through the quarter wavelength plate 28, has the polarization plane rotated by 90°, therefore it reflects at the PBS to reach a polarizer 30. On the other hand, the reference laser beam 27 once passes forward and backward through a quarter wavelength plate 29 with a back face being a reflection plane (a reference plane) and reaches the polarizer 30. The laser beam 7 resulting from the interference between the measurement and the reference laser beams has a varing intensity which varies in proportion to the displacement X of the XY stage 6 which is a measurement object. Therefore, the interference beam 7 is photoelectric-converted by a photo-detector 8 and the resultant electric signal is processed by an optical-path length difference measuring device 9 to provide an output 10 indicative of the displacement X. Generally, the measured output 10 is fed back to a stage control circuit 11 to position the XY stage 6 in a closed loop control system so that it agrees with a target value.

In this case, the accuracy of stability in positioning or stopping the XY stage 6 is greatly affected by a measurement resolution and a measurement accuracy caused in the measuring system as well as causes by the control system. The most serious problem is that the measurement accuracy will deteriorate owing to the fluctuation of air in the neighborhood of the measurement laser beam 4. In order to minimize this deterioration, in accordance with this embodiment, the temperature-controlled air flow taken from e.g. a chamber (not shown) is guided to a blowout vent 13 through a duct 12; the blowout vent 13 regulates the air flow into a laminar air flow 14 which will be uniformly blown or sprayed on the measurement laser beam 4. Experiments by inventors of the present invention clarified that this technique enhances the accuracy of positioning the XY stage by about several times as compared with the case where such air flow is not used, and is also efficient to remove disturbance in heat, air pressure, etc.

The details of the air blowout vent 13 will be explained with reference to FIGS. 2 and 3. A more stable measurement may be obtained by the air blowout vent 13 which expands the air flow supplied through the duct 12, and blows the air flow which is uniform in its temperature distribution and uniform in its flow speed over the entire optical path of the laser beam 4. To this end, arrangements of the air blowout vent 13 as shown in FIGS. 2 and 3 will be proposed. In FIG. 3, the air flow supplied through the duct 12 passes through a filter 15, preliminarily. The filter 15 serves to adsorb dust in the air flow and also make uniform or smooth the temperature distribution of the air flow generated during the air flow flows through the duct 12. The air flow can also be regulated by louvers 16.

While, in an arrangement illustrated in FIG. 2, the air flow vent 13 is designed to have a filter 15 located at the lower side (outlet) of the vent 13. The design as shown in FIG. 2 has the following advantages. The filter 15 located at the lower side of the vent 13 is accompanied by a flowing-out resistance so that the pressure within the vent 13 is uniformly applied over the entire surface of the filter 15; therefore, the air flow 14 passed through the filter 15 becomes similar to a laminar air flow which is substantially fixed in its flowing speed and direction over the entire zone of the filter 15. Since the filter 15 is located at more downstream side than in the case of FIG. 3, the air flow is blown onto the laser beam immediately after its temperature distribution has been uniform or smooth. Since the filter in FIG. 2 has a larger passing area than that of FIG. 3, the degree of dispersing the flowing-out resistance in the former is larger than that in the latter. Therefore, when the same flowing-in pressure of the air flow is applied, the flowing-out speed in the former can be made higher than that in the latter.

Figure 3:
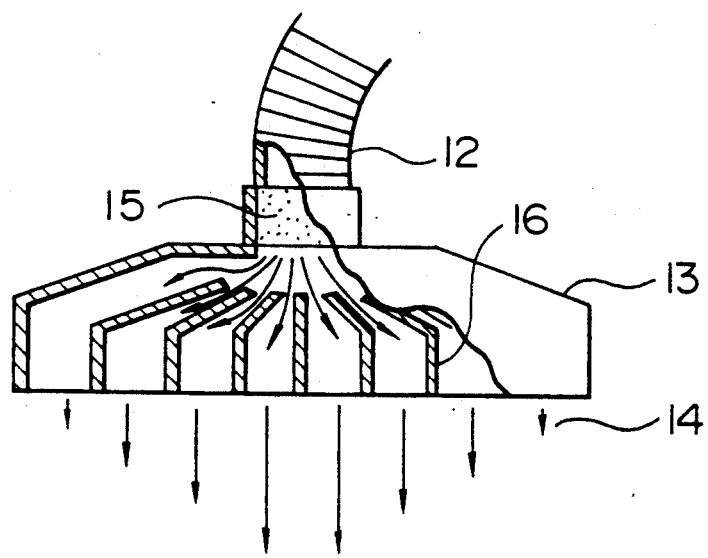

In view of the advantages described above, it is apparent that the air flow vent 13 having the air filter 15 designed as shown in FIG. 2 is more suitable to this embodiment than that as shown in FIG. 3. This applies to other embodiments of the present invention.

Figure 4:
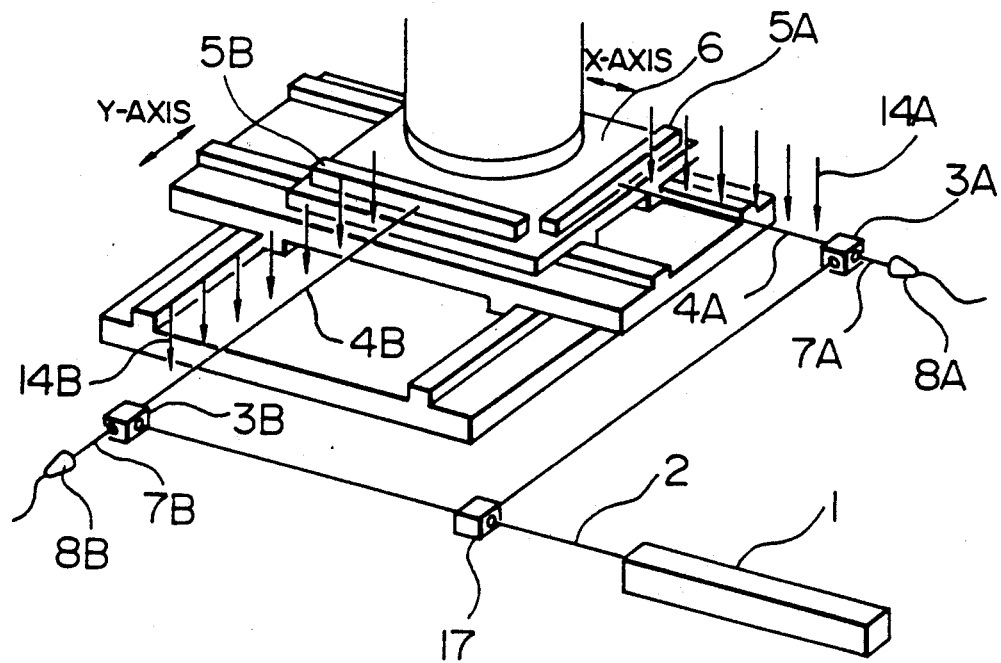
FIG. 4 is a perspective view showing another embodiment of the present invention applied to an X-Y stage system.

Now referring to FIG. 4, an explanation will be given of an embodiment in which the idea of the present invention is applied to an XY stage for a stepper. In FIG. 4, like reference numerals (with suffixes A and B) designate like elements in FIGS. 1 to 3.

In FIG. 4, numeral 17 denotes a beam splitter for dividing a laser beam 2 emitted from a laser source 1 into two parts for an X axis and a Y axis; 3A and 3B denote interferometers; 4A and 4B denote laser beams for measurement; 5A and 5B denote bar mirrors located on the XY stage 6; 8A and 8B denote photo-detectors; and 14A and 14B denote temperature-controlled air flows similar to a laminar air flow. It should be noted that the air flows 14A and 14B are blown out from the corresponding air blowout vents as shown in FIG. 2. Further, it should be noted that although the air flows shown in FIG. 4 are 'downflow' which flows downward from the upside, only in view of restricting the air fluctuation disadvantageous to the laser interferometer apparatus, they may not intend to be 'sideflows' or 'upflows' as long as they are perpendicular to the laser beam.

The operation of this embodiment is as follows. A laser beam 2 emitted from the laser source 1 is divided into two parts for the X axis and the Y axis by the beam splitter 17. The beams thus produced are guided to the corresponding interferometers 3A and 3B. The following explanation can be applied to both X and Y axes although it will be made only about the X axis. The interferometer 3A is composed of a polarizing beam splitter, a quarter wavelength plate, a polarizer, etc., similar to that shown in FIG. 1, therefore, the details thereof will not be explained here. A measurement laser beam 4A emitted from the interferometer 3A reaches the bar mirror 5A located on the XY stage and reflects from there, thereby permitting the displacement of the XY stage in the X direction to be measured. The displacement can be measured in such a manner that the interference light 7A with intensity variation is photoelectrically converted and is measured by the optical path length difference measuring device (not shown), as in the previous embodiment.

In such an arrangement of this embodiment, the refractive index of the air on the measurement laser beams 4A and 4B will vary owing to a temperature distribution or temperature change in the neighborhood and to a change in the air pressure due to movement of the XY stage 6. This will cause a measurement error. In order to remove the measurement error, the air flows 14A and 14B are blown on the laser beams 4A and 4B thereby stabilizing the refractive index. Experiments by the inventors of the present invention clarified that this technique provides the stage stopping accuracy (reproducibility of the stopping position) of ±5 nm or so which is substantially equal to the resolution of the laser interferometer type length measuring apparatus.

Now referring to FIG. 5, an explanation will be given of an embodiment in which the idea of the present invention is applied to the laser interferometer type length measuring apparatus (system) in which a laser beam for compensating the refractive index is positively used to compensate for the air fluctuation. Also in FIG. 5, like reference numerals designate like elements in FIGS. 1 to 4. This embodiment corresponds to an application of the present invention to the prior art shown in FIG. 6.

Figure 5:
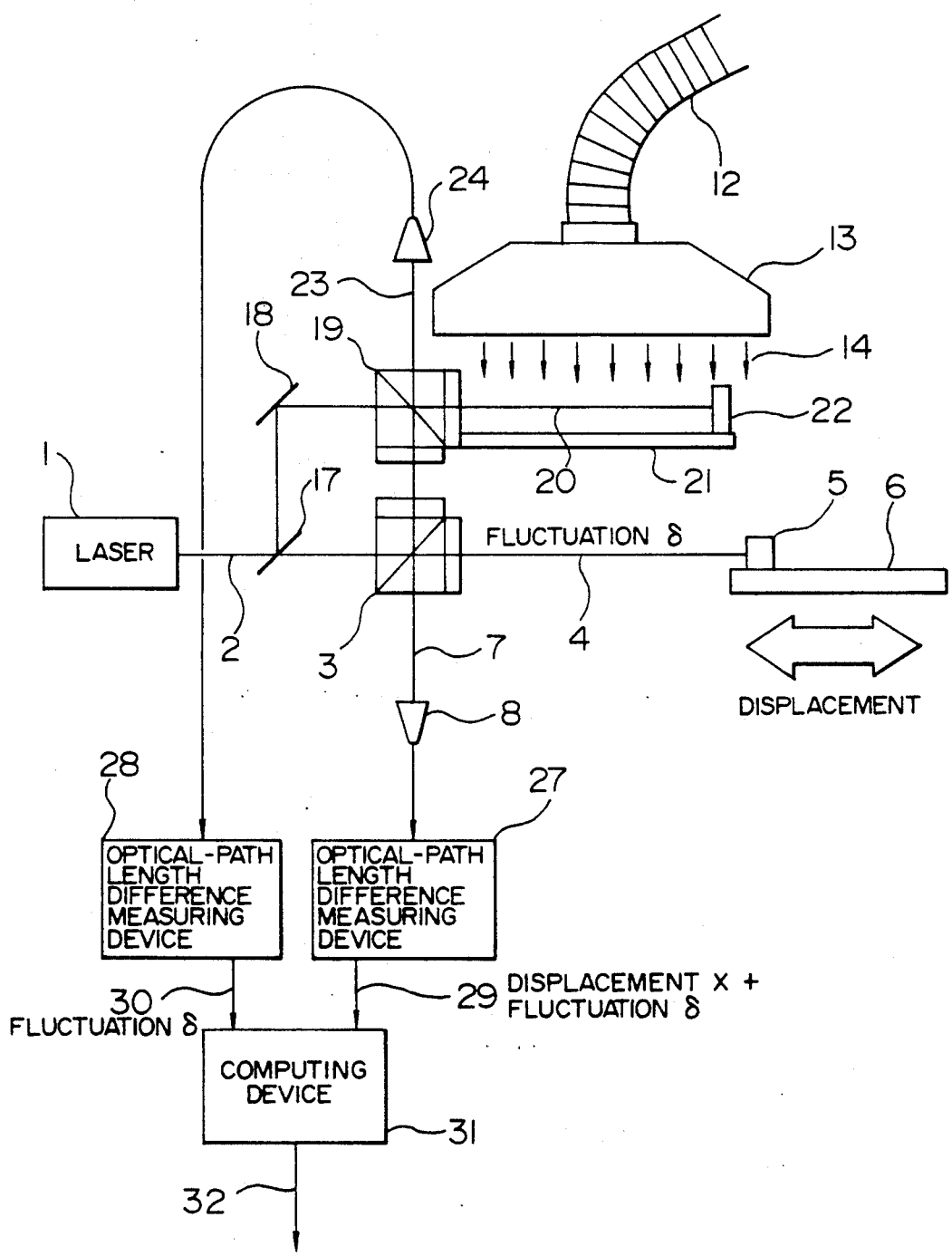
FIG. 5 is a block diagram of the arrangement of the laser interferometer type length measuring apparatus according to a further embodiment of the present invention.
Figure 6:
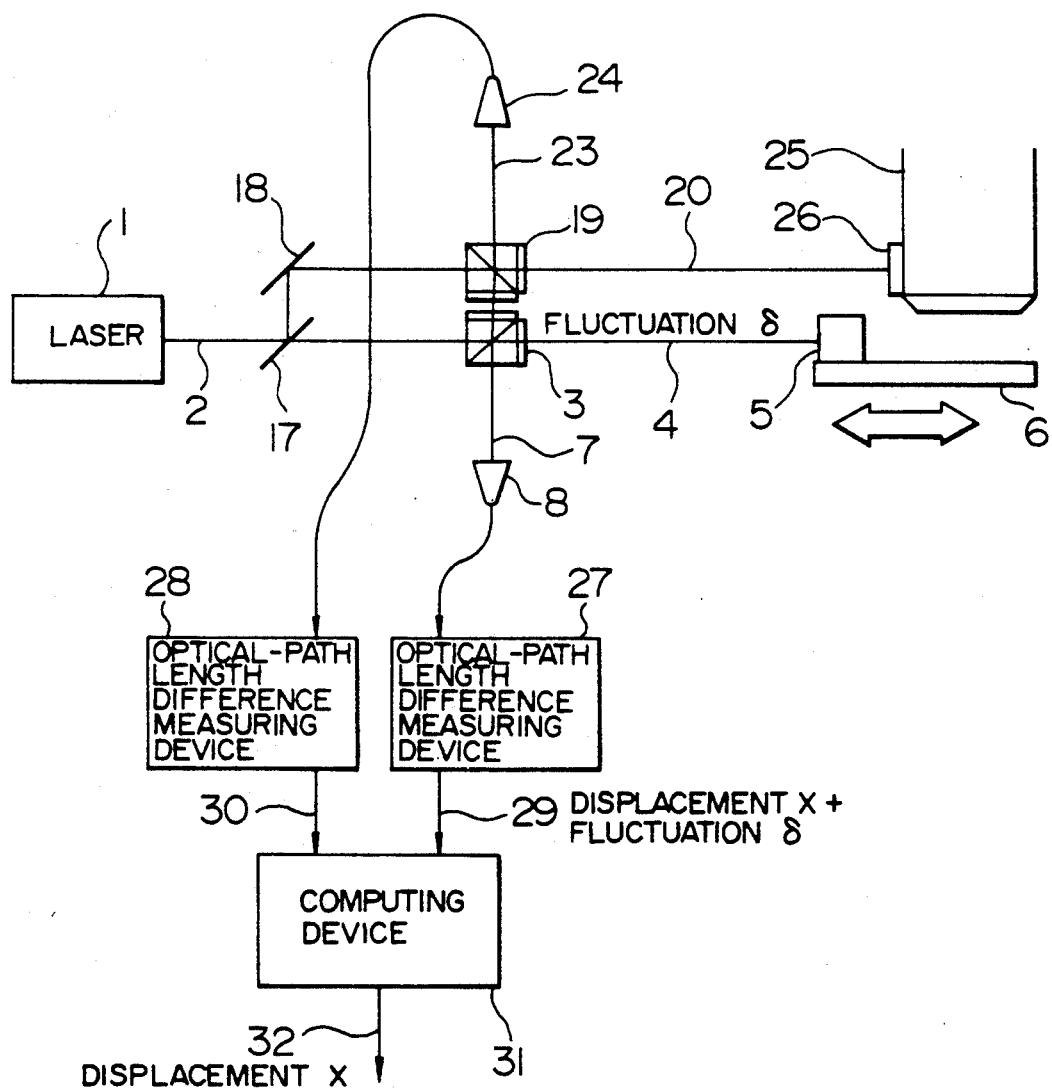
FIG. 6 is a block diagram of a length measuring apparatus according to the prior art.

In FIG. 5, numeral 17 denotes a beam splitter for dividing the laser beam 2 emitted from the laser source 1 into laser beams for measurement and compensation. 3 to 8 denote a measurement optical system designed to measure a displacement of the XY stage 6 as in the previous embodiments. Numeral 19 denotes an interferometer for compensation which is designed the same as the above-mentioned interferometer 3; 20 denotes a laser beam for compensation; 21 denotes a supporting member made of e.g. super-amber for maintaining the distance constant between a mirror 22 and the interferometer 19 which provides an optical path length for compensation; and 24 denotes a photo-detector for detecting the intensity of the interference light 23 from the interferometer 19 for compensation. 27 and 28 denote optical-path length difference measuring devices for processing the outputs from both photo-detectors 8 and 24. Numeral 31 denotes a computing device for compensating of a fluctuation component of the air. 13 denotes an air blowout vent similar to that in FIG. 2, for regulating the temperature-controlled air supplied from the duct 12 to provide the air flow which will be blown on both optical paths of the beams 4 and 21 for measurement and compensation.

The operation of this embodiment is as follows. The laser beam 2 emitted from the laser source 1 is divided into laser beams for measurement and for compensation by the beam splitter 17. The measurement laser beam which serves to measure an object displacement passes through the interferometer 3, reaches the bar mirror 5 located on the XY stage 6 as the object and reflects from the bar mirror 5. The reflected beam of the measurement laser beam 4 interfere with a reference beam in the interferometer 3. The interference light 7 thus obtained is photo-electrically converted by the photo-detector 8. The converted electric signal is processed to provide an output 29 indicative of a measured displacement X of the object including an effect of the air fluctuation δ. On the other hand, the laser beam for compensation, which serves to measure the air fluctuation δ for compensating measurement of the displacement X of the object, reflects at the mirror 18, and reaches the interferometer 19. The interferometer 19 generates an interference light 23 from a reflection beam of the compensation laser beam 20 from the mirror 22 interfered with the reference beam. Using the interference beam 23 thus obtained, a change in the optical-path length difference due to the air fluctuation can be measured over the fixed physical distance between the interferometer 19 and the mirror 22 which are coupled with each other by means of the supporting member 21 made of e.g. super-amber having a small coefficient of linear expansion.

The interference light 23, which intensity varies only owing to the air fluctuation δ on the laser beam 20, is processed by the optical-path length difference measuring device 28 through the photo-detector 24 to provide an output 30 indicative of the air fluctuation δ. The outputs 29 and 30 from the optical-path length difference measuring devices 27 and 28 are operated by the computing device 31 in accordance with a suitable compensation equation to provide a measured output 32 indicative of the displacement X free from the air fluctuation δ.

Meanwhile, in most cases, the above operation according to the compensation equation is performed assuming that the refractive indices of the air change uniformly over the optical paths as the same in both of the beams 4 and 20. Therefore, in the cases where the refractive index varies along the laser beam with respect to one or both of the beams 4 and 20, or the refractive index changes in different rates between the two beams, the displacement will be incompletely compensated by a conventional method so that the output 32 indicative of the displacement X involves a measurement error. In order to realize the above assumption, it is ideal that both laser beams 4 and 20 are located as near as possible to each other and with their optical path length as equal as possible. But this cannot be actually realized. In fact, they are inevitably located apart from each other by a certain distance, and the difference between the optical path lengths of the two laser beams will vary in accordance with movement of the object 6. Further, the movement of the object will greatly change the distribution of the air pressure on the measurement laser beam 4. Thus, the above measured displacement X will include the measurement error.

In order to solve such a problem, in accordance with this embodiment, the temperature-controlled air supplied from the duct 12 are blown on the both laser beams 4 and 20 as the air flow 14 from the air blowout vent 13 similar to one illustrated in FIG. 2. This results in a substantially flat temperature distribution and greatly reduces a temperature variation on both laser beams (optical paths), and also can provide a system which is immune to thermal disturbance. Further, the air flow 14 eliminates a distribution of the air pressure on the laser beam 4 due to movement of the XY stage 6. A measured displacement of the XY stage which is very approximate to its real value can be obtained immediately after the XY stage stops.

In accordance with the present invention, the refractive indices of the air on the optical paths namely dead paths of a laser interferometer type length measuring apparatus can be always maintained uniform and constant. Specifically, because causes of measurement errors such as changes in the temperature and air pressure which will change the refractive index of air can be removed, the laser interferometer type length measuring apparatus according to the present invention can provide a measurement accuracy enhanced by several times as compared with the prior art. Further, experiments by the inventors relating to the present invention clarified that in positioning the stage, two sets of the laser interferometer type length measuring apparatus according to the present invention can provide a stage stopping accuracy of about ±5 nm or so enhanced by three or four times as compared with the prior art.

We claim:

1. A laser interferometer type length measuring apparatus for measuring a relative displacement of an object from an interferometer using a laser beam for measurement running through the air emitted from the interferometer and reflected from the object to return to the interferometer, comprising air blowing means for blowing an air flow on a substantially entire optical path in the air of the measurement laser beam in a direction substantially perpendicular to the optical path in the air of the measurement laser beam.

2. A laser interferometer type length measuring apparatus according to claim 1, wherein said air blowing means comprises a filter for flowing an air flow having an air distribution which is uniform along the optical path of the measurement laser beam.

3. A laser interferometer type length measuring apparatus according to claim 1, wherein said air flow is controlled at a predetermined temperature.

4. A laser interferometer type length measuring apparatus for measuring a relative displacement of an object from an interferometer using a laser beam for measurement running through the air emitted from the interferometer and reflected from the object to return to the interferometer and reflected from the object to return to the interferometer, comprising air blowing means for blowing an air flow having a predetermined temperature and a uniform velocity distribution on a substantially entire optical path in the air of the measurement laser beam in a direction substantially perpendicular to the optical path in the air of the measurement laser beam.

5. A laser interferometer type length measuring apparatus according to claim 1, further comprising an interferometer for compensation, wherein a compensation laser beam emitted from said interferometer for compensation and reflecting from a reference plane apart from said interferometer for compensation by a predetermined distance to return to said interferometer for compensation is placed in the air in the neighborhood of said measurement laser beam, and said compensation laser beam is used to measure the influence from air fluctuation which will be used to compensate the influence from the air fluctuation included in the measured displacement of said object measured by using said measurement laser beam, and wherein said air blowing means is adapted to blow said air flow on a substantially entire optical paths in the air of both said measurement laser beam and said compensation laser beam.

6. A laser interferometer type length measuring apparatus according to claim 1, said air blowing means comprising a filter located at the most downstream position of said air blowing means opposite to the substantially entire optical path so that the air controlled at a predetermined temperature introduced behind said filter is blown through said filter.

7. A method of positioning an object with eliminating influence of air fluctuation, comprising the steps of measuring a displacement of the object by using the laser interferometer type length measuring apparatus according to claim 1, and feeding a difference from a target value of the displacement back to a mechanism for driving said object to be positioned.

8. A method of positioning an object with eliminating influence of air fluctuation, comprising the steps of measuring a displacement of the object by using the laser interferometer type length measuring apparatus according to claim 4, and feeding a difference from a target value of the displacement back to a mechanism for driving said object to be positioned.

9. A laser interferometer type length measuring apparatus according to claim 2, said air blowing means comprising a filter located at the most downstream position of said air blowing means opposite to the substantially entire optical path so that the air controlled at a predetermined temperature introduced behind said filter is blown through said filter.

10. A laser interferometer type lens measuring apparatus according to claim 5, wherein said air blowing means is adapted to blow the air flow in a direction substantially perpendicular to the optical path in the air of the compensation laser beam.

* * * * *